United States Patent
Park et al.

(10) Patent No.: US 7,432,755 B1
(45) Date of Patent: Oct. 7, 2008

(54) PROGRAMMING CURRENT STABILIZED ELECTRICAL FUSE PROGRAMMING CIRCUIT AND METHOD

(75) Inventors: Byeongju Park, Plainview, NY (US); Deok-kee Kim, Bedford Hills, NY (US); John Matthew Safran, Wappingers Falls, NY (US); Yongsang Cho, Kyunggido (KR)

(73) Assignees: International Business Machines Corporation, Armonk, NY (US); Samsung Electronics Co. Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/949,426

(22) Filed: Dec. 3, 2007

(51) Int. Cl.
*H01H 37/76* (2006.01)
*G06F 11/16* (2006.01)

(52) U.S. Cl. .................. 327/525; 327/526; 365/225.7

(58) Field of Classification Search .............. 327/525, 327/526; 365/225.7
See application file for complete search history.

(56) References Cited

U.S. PATENT DOCUMENTS

| | | | |
|---|---|---|---|
| 4,751,498 A | 6/1988 | Shalvi et al. | |
| 4,858,233 A | 8/1989 | Dyson et al. | |
| 5,200,652 A | 4/1993 | Lee | |
| 5,384,481 A | 1/1995 | Holzworth et al. | |
| 5,568,081 A | 10/1996 | Lui et al. | |
| 5,572,050 A | 11/1996 | Cohen | |
| 5,659,182 A | 8/1997 | Cohen | |
| 5,661,323 A * | 8/1997 | Choi et al. | 257/378 |
| 6,009,029 A | 12/1999 | Sher | |
| 6,088,256 A | 7/2000 | Worley et al. | |
| 6,125,069 A * | 9/2000 | Aoki | 365/225.7 |
| 6,141,245 A | 10/2000 | Bertin et al. | |
| 6,486,528 B1 | 11/2002 | Pedersen et al. | |
| 6,570,207 B2 | 5/2003 | Hsu et al. | |
| 6,819,160 B2 * | 11/2004 | Saitoh | 327/525 |
| 6,897,674 B2 | 5/2005 | Braceras et al. | |
| 6,933,591 B1 | 8/2005 | Sidhu et al. | |
| 6,940,777 B2 | 9/2005 | Ooishi | |
| 7,153,712 B1 | 12/2006 | Sidhu et al. | |

(Continued)

FOREIGN PATENT DOCUMENTS

JP    2001319329    11/2001

OTHER PUBLICATIONS da Silva, et al., Allocation of Protective Devices in Distribution Circuits Using Nonlinear Programming Models and Genetic Algorithms, Dept. of Electrical Engineering, Sao Paulo State University, Electric Power Systems Research, vol. 69, Issue 1 Apr. 2004, pp. 77-84. Abstract Only.

(Continued)

*Primary Examiner*—Kenneth B. Wells
(74) *Attorney, Agent, or Firm*—Scully, Scott, Murphy & Presser; Yaumin Cai

(57) ABSTRACT

An electrical fuse programming circuit and a method for programming an electrical fuse within the electrical fuse programming circuit use a programming circuit bus to which are electrically connected in parallel the electrical fuse and a bypass resistor. A current within the programming circuit bus is made to flow through the bypass resistor for a period of time sufficient to stabilize the current, and then sequentially and instantaneously switched to program the electrical fuse.

2 Claims, 2 Drawing Sheets

U.S. PATENT DOCUMENTS

| | | |
|---|---|---|
| 7,180,320 B2 | 2/2007 | Braceras et al. |
| 7,254,078 B1 | 8/2007 | Park et al. |
| 2003/0042970 A1 | 3/2003 | Humphrey |

OTHER PUBLICATIONS

Bergemont, et al., High Voltage Driver Built in a Low Voltage 0.18 mu m CMOS for cache redundancy applications in microprocessors, 12th International Symposium on Power Semiconductor Devices & Ics: Toulouse, May 22-25, 2000. Abstract Only.

Fitzgerald, et al., Semiconductor Memory Redundancy at the Module Level; IBM Technical Disclosure Bulletin, vol. 23, No. 8, p. 3601-2, Jan. 1981. Abstract Only.

Greve, D.W., Programming Mechanism of Polysilicon Resistor Fuses, Solid State Circuits, IEEE Journal of, Publication Date: Apr. 1982, vol. 17, Issue 2 pp. 349-354. Abstract Only.

Hoefler, et al., Analysis of a Novel Electrically Programmable Active Fuse For Advanced CMOS SOI One-Time Programmable Memory Applications, Solid State Device Research Conference 2006, ESSDERC 2006, Proceeding of the 36th European; Publication Date: Sep. 2006, pp. 230-233. Abstract Only.

Kalnitsky, A., et al. CoSi2 Integrated Fuses on Poly Silicon for Low Voltage 0.18 um CMOS Applications, Electron Devices Meting, 1999 IEDM Technical Digest International, Publication Date: 1999 pp. 765-768. Abstract Only.

Kim, J.D., et al., Two-Dimensional Modelling for the Current Density Distribution in a Heavily Doped Semiconductor Resistor, Semiconductor Division, Electronics and Telecommunications Research Institute, International Journal of Eelctronics, 1997, vol. 82, No. 1, pp. 19-25. Abstract Only.

Kothandaramnan, C., et al., Electronically Programmable fuse (efuse) using Electromigration Insilicides, Electron Device Letter, IEEE, Publication Date: Sep. 2002, vol. 23, Issue 9. Abstract Only.

Mathur, N., et al., One-time Programming Device Yeild Study Based on Anti-fuse Gate Oxide Breakdown on P-type and N-type substrates, International Integrated Reliability Workshop Final Report, 2005, pp. 111-113. Abstract Only.

Min, B.J., et al. An Embedded Non-Volatile FRAM with Electrical Fuse Repair Scheme and One Time Programming Scheme for High Performance Smart Cards, Conference; IEEE Solid State Circuits Society, 2005 pp. 255-258. Abstract Only.

Ohtsuka, N., et al., A 4-Mbit CMOS EPROM, Solid State Circuits, IEEE Journal of; Publication Date: Oct. 1987; vol. 22, Issue 5, pp. 669-675. Abstract Only.

Rajsuman, R., Design of Reprogrammable FPLA, Electronics Letters, Dept. of Comput. Eng., Case Western Reserve Univ., Cleveland, OH.; Publication Date: May 25, 1999, vol. 25, Issue 11. Abstract Only.

Roberts, J.W., et al., A CMOS model for Computer Aided Circuit Analysis and Design, Solid-State Circuits, IEEE Journal of; Publication Date: Feb. 1989, vol. 24, Issue 1. Abstract Only.

Shuichi Sakai, et al., Reduced interprocessor-communication architecture and its implementation on EM-4, Parallel Computing, vol. 21, Issue 5, May 1995; pp. 753-769. Abstract Only.

Sasaki, T., et al., Melt-segregate-quench Programming of Electrical Fuse; IEEE Electron Devices Society Symposium Proceedings, 2005; 43rd, pp. 347-351. Abstract Only.

Otis Smart, et al., Genetic Programming of Conventional Features to Detect Seizure Precursors; Intelligent Control System Laboratory, Biomedical Engineering,GeorgiaInstitute of Technology, Dec. 7, 2005. Abstract Only.

Wang, S.J., et al.; High-Performance Metal/Silicide Antifuse [for CMOS technology], Electronic Device Letters, IEEE, Publication Date: Sep. 1992, vol. 13, Issue 9.

\* cited by examiner

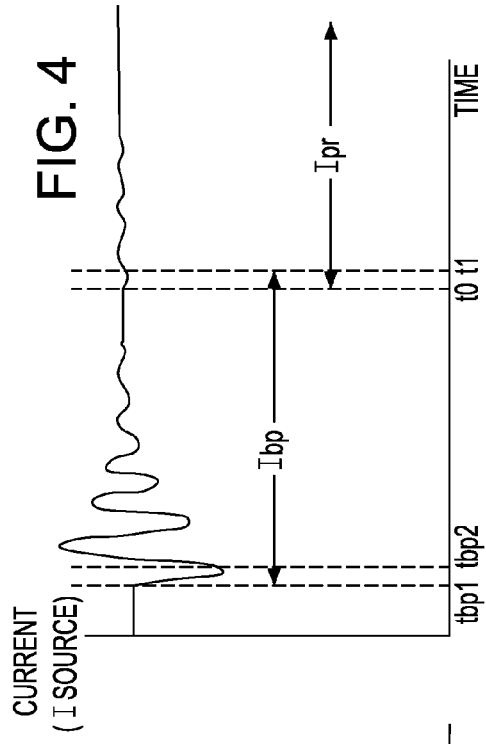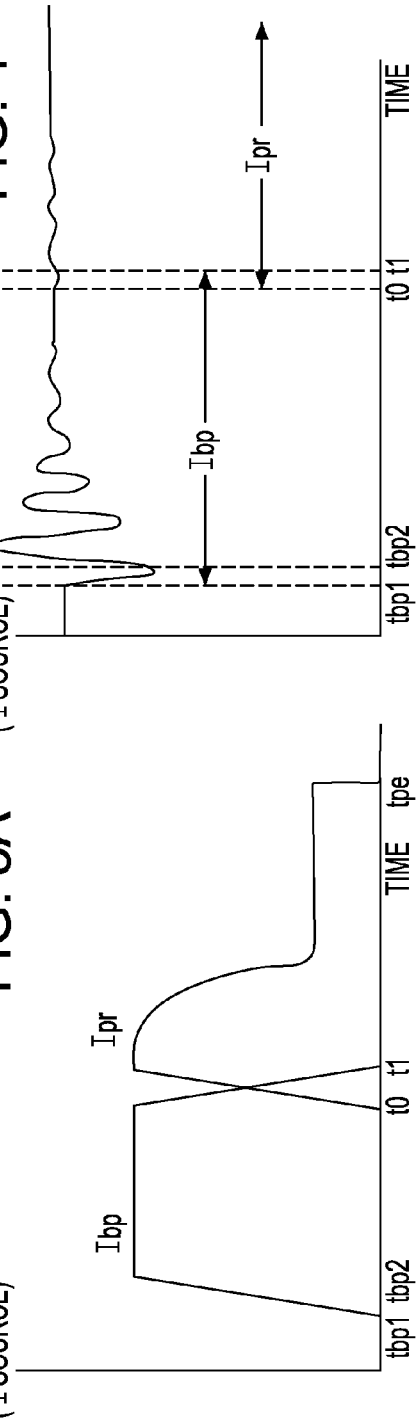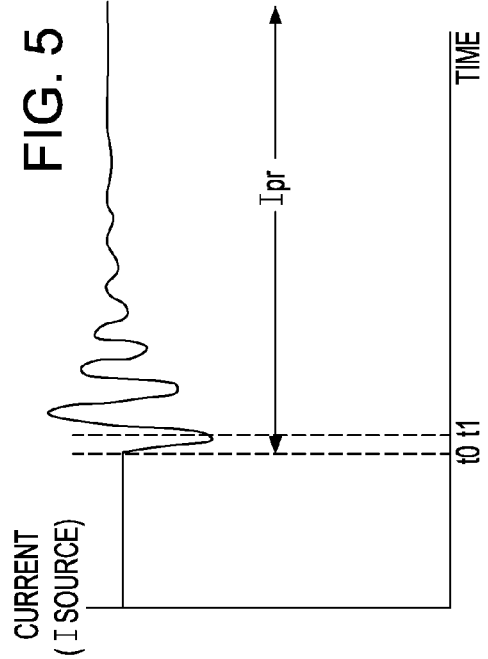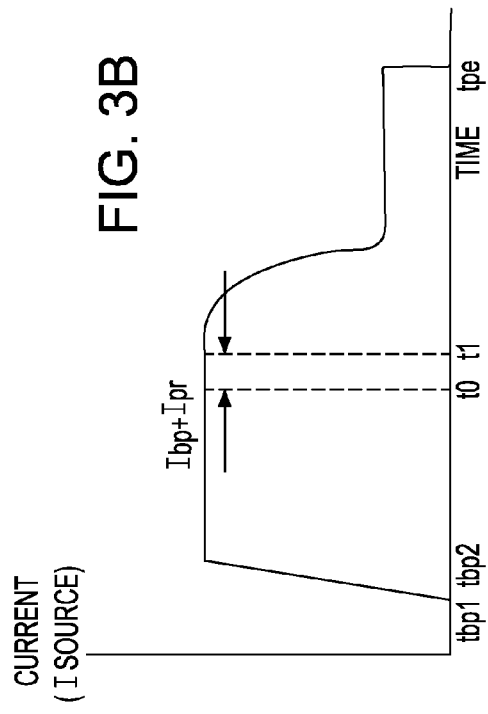

PROGRAMMING CURRENT STABILIZED ELECTRICAL FUSE PROGRAMMING CIRCUIT AND METHOD

BACKGROUND

1. Field of the Invention

The invention relates generally to electrical fuse programming circuits within semiconductor circuits. More particularly, the invention relates to effective and efficient electrical fuse programming circuits within semiconductor circuits.

2. Description of the Related Art

In addition to resistors, transistors, diodes and capacitors, semiconductor circuits often also include electrical fuses and electrical fuse structures that are located within electrical fuse programming circuits. Electrical fuses and electrical fuse structures within electrical fuse programming circuits are intended to provide an efficient means for substituting defective or otherwise non-functional semiconductor circuit components within a semiconductor circuit. Such an efficient substitution of defective or otherwise non-functional semiconductor circuit components within a semiconductor circuit is particularly common within memory circuits, such as random access memory circuits. Such memory circuits often comprise multiple redundant circuit blocks for which appropriate substitutions may be made by programming of an electrical fuse located within an electrical fuse programming circuit. Other applications such as trimming parameters of device components such as resistors or capacitors are also known.

While electrical fuses and electrical fuse structures within electrical fuse programming circuits are thus desirable within semiconductor circuits, electrical fuses and electrical fuse structures within electrical fuse programming circuits are nonetheless not entirely without problems in the semiconductor fabrication art. In particular, the process of programming an electrical fuse within an electrical fuse programming circuit is not necessarily always reproducible. Similarly, such irreproducible electrical fuse programming may under certain circumstances lead to substituted semiconductor circuit components which although expected to be functional, are in fact not functional.

Since electrical fuses and electrical fuse structures within electrical fuse programming circuits are likely to be of considerable continued interest for efficiently fabricating semiconductor circuits, desirable are electrical fuse programming circuits and related methods for operation thereof that provide for efficient and effective programming of the electrical fuses and electrical fuse structures within the electrical fuse programming circuits.

SUMMARY

The present invention addresses the needs described above by providing an electrical fuse programming circuitry that directs a stabilized current to an electrical fuse with a minimal level of transient currents, for programming of the electrical fuse.

The invention is predicated upon the expectation that programming of an electrical fuse is sensitive to a programming voltage and a programming current. The invention is also predicated upon the expectation that the initial phase of electrical fuse programming, typically within a few microseconds, has a significant effect on the electrical characteristics of the programmed electrical fuse, for example, a resistance of the programmed electrical fuse. The invention further considers that programming conditions, in terms of stability of a voltage supply and a current supply may not be ideal, especially for programming of an electrical fuse during operation of a semiconductor chip in the field. In other words, the invention considers that a voltage supply and a current supply may be marginal for some instances of electrical fuse programming.

The invention addresses a need for electrical fuses and electrical fuse structures that may be programmed even under adverse programming conditions, such as a marginal programming voltage and current supply.

The invention provides an electrical fuse programming circuit, and a method for programming an electrical fuse within the electrical fuse programming circuit, while using a current from a current source electrically connected to a programming circuit bus to which is electrically connected the electrical fuse. The electrical fuse programming circuit also includes a bypass resistor that is electrically connected to the programming circuit bus in parallel with the electrical fuse that is electrically connected to the programming circuit bus. Finally, the electrical fuse programming circuit also includes a means for sequentially and instantaneously switching the current within the programming circuit bus to first pass through the bypass resistor (i.e., for a period of time sufficient to provide a stabilized current) and then to program the electrical fuse. By using such a sequential and instantaneous switching of the stabilized current from the bypass resistor and then to program the electrical fuse, rather than directly programming the electrical fuse with an unstabilized current, the invention provides a more uniform programming of the electrical fuse.

A particular electrical fuse programming circuit in accordance with the invention includes a combination of an electrical fuse in series with a programming transistor connected to a programming circuit bus. This particular electrical fuse programming circuit also includes a combination of a bypass resistor in series with a bypass transistor also connected to the programming circuit bus in parallel with the combination of the electrical fuse in series with the programming transistor. This particular electrical fuse programming circuit also includes a logic circuit means for controlling the programming transistor and bypass transistor to sequentially and instantaneously switch an electrical current within the programming circuit bus to direct the electrical current to first flow through the bypass resistor and then to program the electrical fuse.

A particular method for programming an electrical fuse in accordance with the invention includes providing a current flow through a bypass resistor electrically connected to a programming circuit bus within an electrical fuse programming circuit for a time sufficient to stabilize the current flow, but not an electrical fuse electrically connected in parallel with the bypass resistor to the programming circuit bus within the electrical fuse programming circuit. This particular method also includes sequentially and instantaneously switching the current from the bypass resistor to program the electrical fuse.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 3A and FIG. 3B show a pair of graphs illustrating bypass current and programming current versus time for programming an electrical fuse in accordance with the electrical fuse programming circuit of FIG. 1.

FIG. 4 shows a graph of current versus time for programming an electrical fuse using an electrical fuse programming circuit in accordance with the invention.

FIG. 5 shows a graph of current versus time for programming an electrical fuse while not using an electrical fuse programming circuit in accordance with the invention.

DESCRIPTION OF THE PREFERRED EMBODIMENT

The invention, which includes an electrical fuse programming circuit, as well as a method for programming an electrical fuse within the electrical fuse programming circuit, is understood within the context of the description set forth below. The description set forth below is understood within the context of the drawings described above. Since the drawings are intended for illustrative purposes, the drawings are not necessarily drawn to scale.

Figure 1:
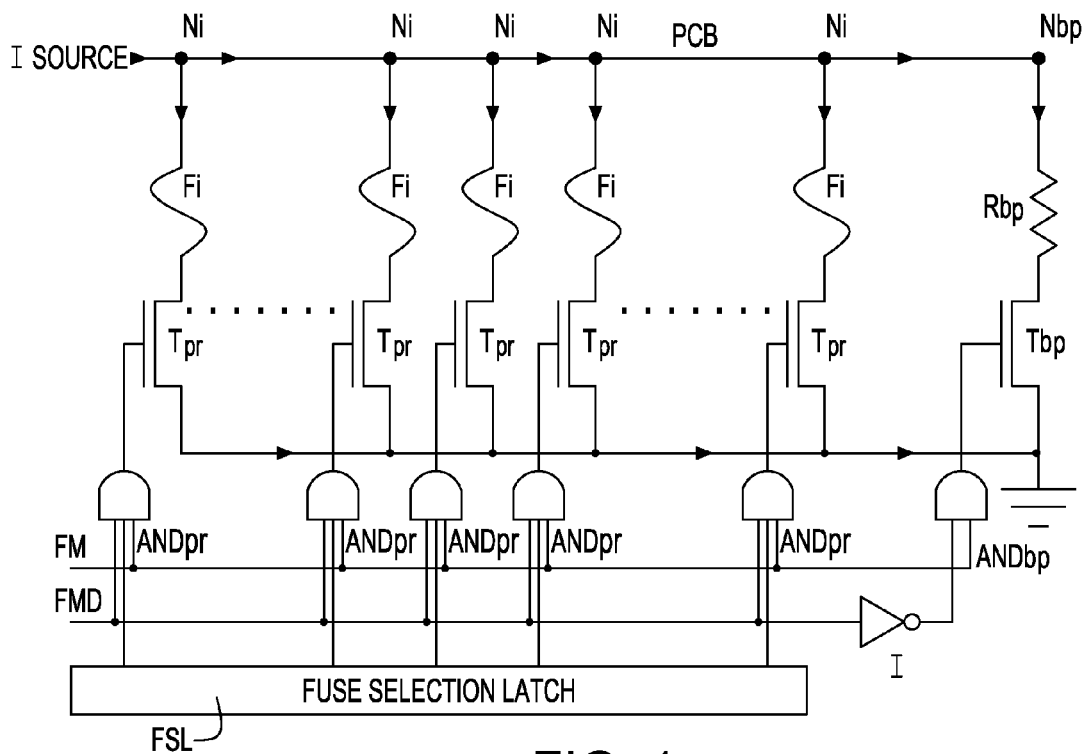
FIG. 1 shows a schematic diagram of an electrical fuse programming circuit in accordance with an embodiment of the invention.

FIG. 1 shows an electrical fuse programming circuit in accordance with an embodiment of the invention.

FIG. 1 shows a plurality of electrical fuses Fi (i.e., where i is intended to be incremented to represent a sequential and integral number of electrical fuses) each of which is electrically connected at one end in series with an end of each of a corresponding plurality of programming transistors Tpr. The remaining ends of the electrical fuses Fi are connected via a corresponding series of nodes Ni to a programming circuit bus PCB at one end of which is a connection to a current source Isource. The remaining ends of the programming transistors Tpr are connected to a programming circuit ground PCG. Also connected in parallel (i.e., also interposed in parallel between the programming circuit bus PCB and the programming circuit ground PCG) with each of the electrical fuses Fi and the programming transistors Tpr is a bypass resistor Rbp that is connected in series with a bypass transistor Tbp. The bypass resistor Rbp is connected to the programming circuit bus PCB at a node Nbp. The embodiment also contemplates a reversed location of any or all of the electrical fuses Fi with respect to the programming transistors Tpr, or a reversed location of the bypass resistor Rbp with respect to the bypass transistor Tbp. The embodiment also preferably provides that each of the electrical fuses Fi (i.e., each node Ni) is located interposed between the current source Isource and the bypass resistor Rbp (i.e, the node Nbp) within the programming current bus PCB.

Within the portion of the electrical fuse programming circuit whose schematic diagram is illustrated in FIG. 1, and that is described above, the current Isource is typically from about 1 mA to about 20 mA, and typically from about 2 mA to about 10 mA, and the electrical fuse programming circuit typically operates at a voltage from about 1.0 V to about 4.0 V, and typically from about 1.5 V to about 3.0V. The electrical fuses Fi as described above are otherwise generally conventional in the semiconductor fabrication art, and they typically comprise materials that are also otherwise generally conventional in the semiconductor fabrication art.

The bypass resistor Rbp is intended to be chosen to supply a load carrying resistance similar to the load carrying resistance of the electrical fuses Fi. Typically, such a resistance is from about 100 Ohms to about 300 Ohms. The bypass resistor Rbp may comprise the same material as the electrical fuses Fi to match temperature coefficients of the resistance between the bypass resistor Rbp and the electrical fuses Fi. For example, the bypass resistor Rbp may comprise an enlarged version of one of the electrical fuses Fi in which the lateral dimensions are greater than corresponding lateral dimensions of the electrical fuse Fi. Alternately, the bypass resistor Rbp may comprise an n×n array of electrical fuses that are connected in a grid arrangement so that the total resistance of the n×n array is the same as the resistance of a single electrical fuse Fi.

The programming transistors Tpr and the bypass transistor Tbp are also otherwise generally conventional. The programming transistors Tpr and the bypass transistor Tbp typically comprise field effect transistors, although the invention is by no means so limited.

Finally, the remaining lower portion of the electrical fuse programming circuit of FIG. 1 whose components have not yet been described is intended to illustrate a logic circuit that connects to the gates of the individual programming transistors Tpr, or the bypass transistor Tbp. In particular each of the gates of the programming transistors Tpr is connected to an output of a corresponding programming AND gate ANDpr. The inputs of each of the programming AND gates ANDpr include an electrical fuse master FM signal, a delayed electrical fuse master FMD signal and an electrical fuse selection latch FSL signal. The gate of the bypass transistor Tbp is connected to the output of a bypass AND gate ANDbp whose inputs include the electrical fuse master FM signal, as well as an inverted delayed electrical fuse master FMD signal that is inverted through a signal inverter I.

As noted above, the nodes Ni at which the electrical fuses Fi are connected to the programming circuit bus PCB are interposed between the node Nbp at which the bypass resistor is connected to the programming circuit bus PCB and a current source Isource connection of the programming circuit bus PCB. Thus, a "redirection" of current as described below at a time of current source Isource switching occurs upstream of the electrical fuses Fi and the bypass resistor Rbp Any change in current within the programming circuit bus PCB is thus limited to the portion of the programming circuit bus PCB between the node Ni at which the electrical fuse to be programmed is attached and the node Nbp at which the bypass resistor Rbp is attached. Further, since as will be illustrated below the total current through the bypass resistor Rbp and an electrical fuse Fi in the process of programming remains virtually constant, perturbation to the programming circuit bus PCB is minimal, and consequently, voltage fluctuations in the programming circuit bus PCB are also minimal. The stability of the current and voltage supplied to the electrical fuses Fi results in more reliable programming of the electrical fuses Fi and a higher probability of successfully programming the electrical fuses Fi.

Figure 2:
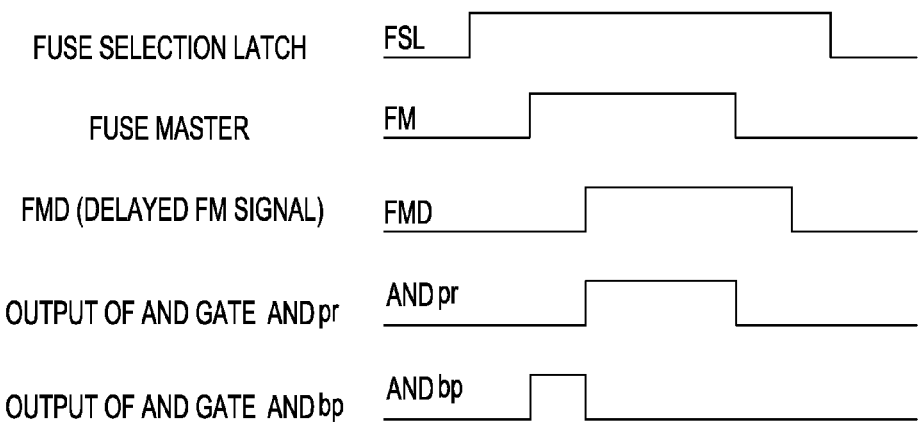
FIG. 2 shows logic levels at various circuit points within the electrical fuse programming circuit of FIG. 1.

FIG. 2 shows a logic level diagram illustrating logic levels from the logic portion of the electrical fuse programming circuit whose schematic diagram is illustrated in FIG. 1.

FIG. 2 shows high and low logic levels of the electrical fuse selection latch FSL, the electrical fuse master FM and the delayed electrical fuse master FMD signals. FIG. 2 also shows the resulting outputs of any particularly selected AND programming gate ANDpr, and the AND bypass gate ANDbp, as a function of the logic levels of the electrical fuse selection latch FSL, the electrical fuse master FM and the delayed electrical fuse master FMD signals. As is illustrated within the logic level diagram of FIG. 2, a desirable illustrated signal level of the electrical fuse selection latch FSL, the electrical fuse master FM and a delayed electrical fuse master FMD signals in accordance with FIG. 2 provides an AND bypass gate ANDbp signal that is sequentially and instantaneously followed by an AND programming gate ANDpr signal. Thus, within the context of the logic level diagram of FIG. 2, the upper portion of the electrical fuse programming circuit of FIG. 1 provides for passage of the current Isource first through the bypass resistor Rbp (i.e., due to actuation of the bypass transistor Tbp) and then sequentially and instantaneously followed by programming of a particularly selected electrical fuse Fi (i.e., due to actuation of a particular corresponding programming transistor Tpr).

Within the context of the embodiment, and as will be illustrated in further detail within the context of further discussion below, sequential and instantaneously switching on and off of the bypass transistor Tbp followed by a sequential and instantaneous switching on of a particular programming transistor Tpr includes a rise time after switching on each of the foregoing transistors and a decay time after switching off each of the foregoing transistors. In addition, the embodiment also contemplates a pulse width for passage of the current Isource through the bypass resistor Rbp for a time sufficient to stabilize the current Isource prior to sequentially and instantaneously programming a particularly selected electrical fuse Fi.

FIG. 3A shows a graph of a bypass current Ibp component (i.e. passing through the bypass resistor Rbp) and a programming current Ipr component (i.e., programming an electrical fuse Fi) of the current Isource as a function of time within the logic level diagram of FIG. 2. Within FIG. 3A, tbp1 represents a turn-on time of the bypass transistor Tbp and tbp2 represents the end of a rise time after the turn-on of the bypass transistor Tbp for a bypass current Ibp to reach a maximum. Typically, tbp2 minus tbp1 equals from about 1 nanosecond to about 500 nanoseconds, although lesser and greater time periods are explicitly contemplated herein. As is illustrated in FIG. 3A, at the time t0, the bypass transistor Tbp is turned off and one of the programming transistors Tpr is simultaneously and instantaneously turned on. Thus there ensues a simultaneous mirrored decay time of the bypass current Ibp and rise time of the programming current Ipr during a time interval t1 minus t0, which is also typically from about 1 nanosecond to about 500 nanoseconds, although lesser and greater time periods are explicitly contemplated herein. As is further illustrated within the graph of FIG. 3A, the programming current Ipr declines to a lower value, typically but not necessarily zero, as a particular electrical fuse Fi is programmed until ending at a time tpe. Within FIG. 3A, t0 minus tbp2 typically equals from about 1 to about 500 microseconds and tpe minus t1 typically equals from about 1 microsecond to about 500 microseconds, although lesser and greater time periods are explicitly contemplated herein for each of t0 minus tbp2 and tpe minus t1.

FIG. 3B shows the addition sum of the bypass current Ibp component and the programming current Ipr component of the current Isource that is illustrated in FIG. 3A. Since the decay characteristics of the bypass current Ibp between t0 and t1 symmetrically mirror the rise characteristics of the programming current Ipr between t0 and t1, the addition sum of the bypass current Ibp and the programming current Ipr provides for a smooth transition from the bypass current Ibp component of the current Isource to the programming current Ipr component of the current Isource during the time period t0 to t1.

As is understood by a person skilled in the art, a change in a level of an electrical current within an electrical circuit is often accompanied by a variation in the stability of the electrical current for a period of time after the change in level of the electrical current. Such a variation in stability typically naturally subsides as a function of time.

FIG. 4 is intended to illustrate such an electrical current instability within the context of the embodiment of the invention. As is illustrated within the graph of FIG. 4, a current Isource fluctuation occurs as a result of turning on the bypass transistor Tbp at the time tbp1 and the current fluctuation lasts for a time that extends past tbp2. By an appropriate selection of a bypass current time interval t0 minus tbp2, the current Isource fluctuation does not extend past the turn on time t0 of the programming transistor Tpr, which is also the turn off time of the bypass transistor Tbp. As a result, the fluctuation in the current Isource immediately after t0 is considerably less than the fluctuation in current Isource immediately after tbp1. As is clear within FIG. 4, a sequential and instantaneous switching of the current Isource from the bypass resistor Rbp (i.e. after a sufficient time to stabilize the current Isource) to program the electrical fuse Fi provides for a more uniform programming of the electrical fuse Fi due to enhanced stability of the current Isource.

For comparison purposes, FIG. 5 shows a current Isource fluctuation diagram that correlates with the current Isource fluctuation diagram of FIG. 4, but absent the use of a bypass current Ibp pulse. As a result of absence of the bypass current Ibp pulse, a current Isource variation (i.e., perturbation) occurs during the rise time t1 minus t0 of the programming current Ipr pulse rather than during a rise time of a bypass current Ibp pulse that precedes the programming current Ipr pulse, as is illustrated in FIG. 4.

The foregoing embodiment is illustrative of the invention rather than limiting of the invention. Revisions and modifications may be made to methods, materials, structures and dimensions of an electrical fuse programming circuit in accordance with the foregoing embodiment, while still providing an electrical fuse programming circuit and method for operation thereof in accordance with the invention, further in accordance with the accompanying claims.

What is claimed is:

1. An electrical fuse programming circuit, comprising:
 a first path including a bypass resistor in series with a first transistor, wherein the first path includes no fuse elements;
 a second path, connected in parallel with said first path, including a fuse element in series with a second transistor; and
 logic circuitry for causing current to sequentially and instantaneously flow through only the first path during a first time period and then flow through only the second path during a second time period immediately following said first time period.

2. A method for programming an electrical fuse, comprising:
 causing a current to flow and stabilize for a first time period through only a first path including a bypass resistor in series with a first transistor, wherein the first path includes no fuse elements; and
 causing said current to sequentially and instantaneously flow through only a second path for a second time period immediately following said first time period, said second path connected in parallel with said first path, and wherein the second path includes a fuse element in series with a second transistor.

* * * * *